United States Patent [19]

Hsu et al.

[11] Patent Number: 4,937,756
[45] Date of Patent: Jun. 26, 1990

[54] GATED ISOLATED STRUCTURE

[75] Inventors: Je-Jung Hsu, Tainan; Hsing-Hai Chen, Shin Chu, both of Taiwan

[73] Assignees: Industrial Technology Research Institute; Chung Shan Institute of Science and Technology, Taiwan

[21] Appl. No.: 300,582

[22] Filed: Jan. 23, 1989

Related U.S. Application Data

[62] Division of Ser. No. 144,272, Jan. 15, 1988, Pat. No. 4,849,366.

[51] Int. Cl.$^5$ ........................ G06F 15/60; H01L 29/78
[52] U.S. Cl. ...................................... 364/490; 364/489; 364/488; 437/75; 437/74; 357/48; 357/50
[58] Field of Search ................................ 364/488–491; 437/74, 75; 357/23.1–23.15, 47, 48, 50

[56] References Cited

U.S. PATENT DOCUMENTS

| | | | |
|---|---|---|---|
| 3,655,457 | 4/1972 | Duffy et al. | 437/74 |
| 3,731,375 | 5/1973 | Agusta et al. | 437/75 |
| 4,456,918 | 6/1984 | Beasom | 357/48 |
| 4,495,694 | 1/1985 | Beasom | 437/148 |
| 4,599,576 | 7/1986 | Yoshida et al. | 357/23.1 |

Primary Examiner—Parshotam S. Lall
Assistant Examiner—V. N. Trans
Attorney, Agent, or Firm—Darby & Darby

[57] ABSTRACT

The invention relates to a radiation-hardened (R-H) bulk CMOS process which is compatible with DRAM production and a specific gated isolation structure (GIS). The GIS structure consists of a novel oxide-silicon nitride-oxynitride gate insulator and a LPCVD polysilicon gate. A simple but automatically generating process for creating GIS directly from an original non-R-H device is also described. This generating process is fast and can revise any commercial products to a R-H version. The GIS is always shunted to Vss potential of the circuit chip to assure R-H capability. The grounded GIS structure replaces conventional LOCOS field oxide, which suffers from large threshold voltage shift when exposed to irradiation. Radiation resistance of this gated isolation structure (GIS) is suitable for application in radiation-immunity VLSI integrated circuits ($\leq 2$um design rule).

2 Claims, 10 Drawing Sheets

CONTACT REGION ≡ D1

Fig. S-6.

MODIFIED CONTACT REGION ≡ D2

GATED ISOLATED STRUCTURE

This is a divisional of co-pending application Ser. No. 144,272 filed on January 15, 1988, now U.S. Pat. No. 4,849,366.

BACKGROUND OF THE INVENTION

It is well known that MOS devices build up trapped positive charges in the oxide and interface states at Si/SiO$_2$ interface, when exposed to ionizing radiation. These effects will induce threshold/flat band voltage shifts and the reduction of transconductance and, as a consequence, degrade the performance of devices and/or circuits. These effects are discussed in C. T. Sah, "Origin of Interface States and Oxide Charges Generated by Ionizing Radiation," *IEEE Transactions on Nuclear Science*, NS-23, No. 6, 1563–1568 (1976) and F. B. Mclean, "A Framework for Understanding Radiation-Induced Interface States in SiO$_2$ MOS Structures," *IEEE Transactions on Nuclear Science*, NS-27, No. 6, 1651–1657 (1980). For example, the p-type substrate of N-channel MOSFET will be inverted to n-type because of the accumulation of trapped positive charges and interface states found in the gate oxide (or other insulator) so that, even without gate bias, these devices have large subthreshold leakage current. It is also expected that an apparent standby current will appear at non-operational states and that circuit function will fail during normal operation cycles with such circuits.

Figure 1:
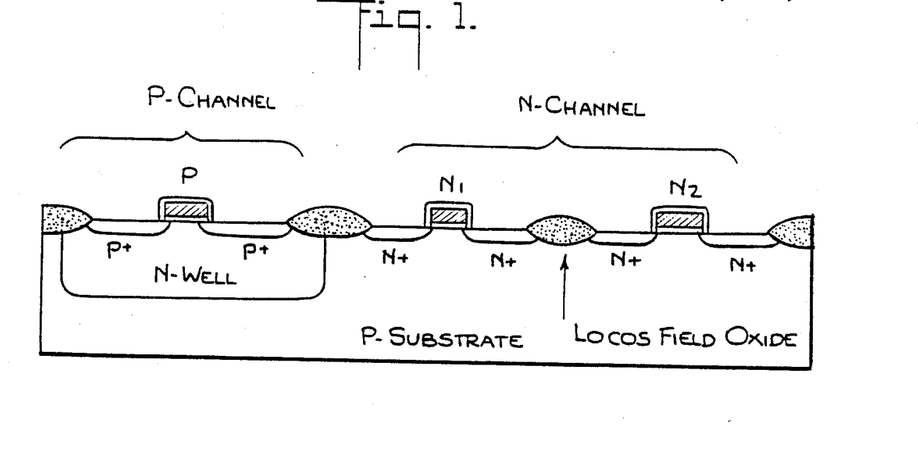
FIG. 1 illustrates a conventional complementary metal oxide semiconductor Fet structure where the electrical isolation between devices is achieved by a LOCOS field oxide.
Figure 2:
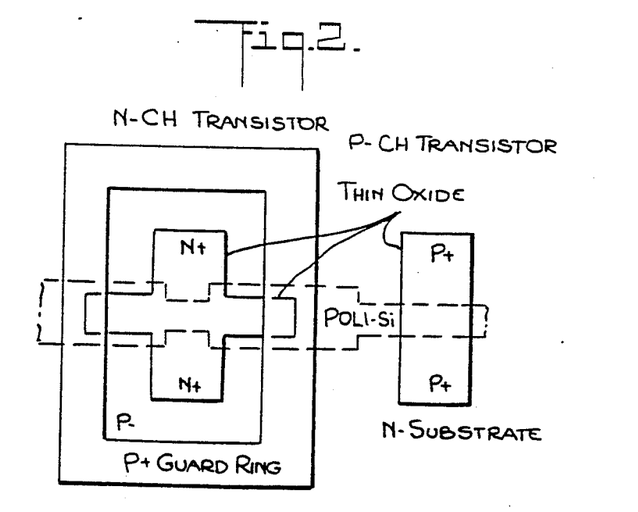
FIG. 2 shows a known CMOS structure having a guard ring surrounding the N-channel transistor.

Generally MOS devices with thick gate oxide layers have larger degradation level. In the conventional CMOS process, the electrical isolation between devices is achieved by LOCOS field oxide, as shown in FIG. 1. The source/drain regions of neighboring devices and field oxide between them therefore form a parasitic MOSFET, which has a thick equivalent gate oxide. The threshold voltage shift induced by irradiation is so substantial that a leakage path underneath the LOCOS region may appear. Many approaches have been developed to solve these problems:

Firstly, guard rings are added as shown in FIG. 2. This approach, however, is not practical for high packing density because of the waste of chip area. Also, the coupling capacitance to the gate region is too large, which usually reduces the speed of operation. J. E. Schroeder et al., "An Advanced, Radiation Hardened Bulk CMOS/LSI Technology, *IEEE Transactions on Nuclear Science*, NS-28, No. 6, 4033–4037 (1981).

Figure 3:
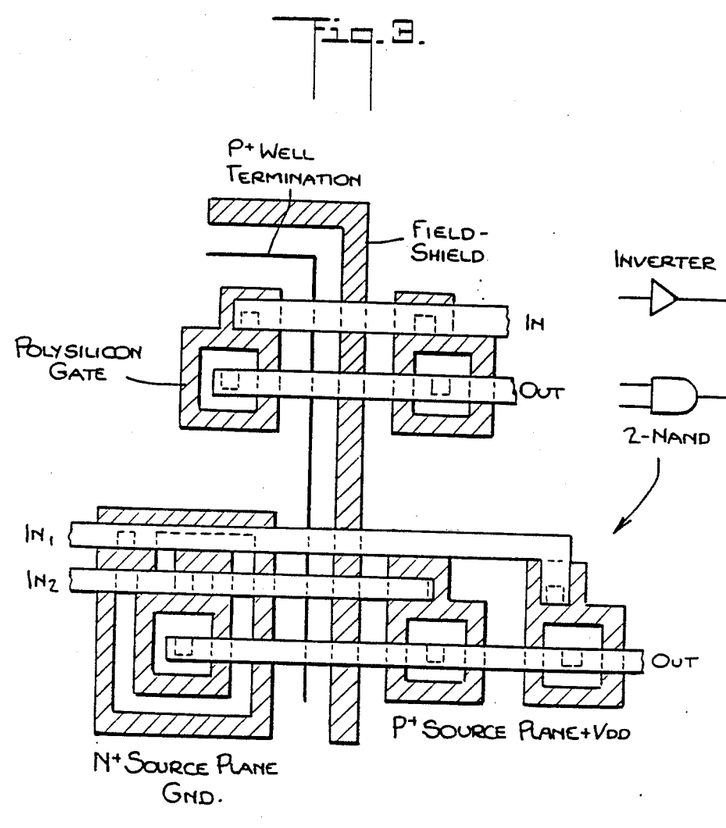
FIG. 3 illustrates an inverter and 2-NAND gate employing the closed structure of the prior art where the drain region is surrounded by a gate region.
Figures 4, 4A:
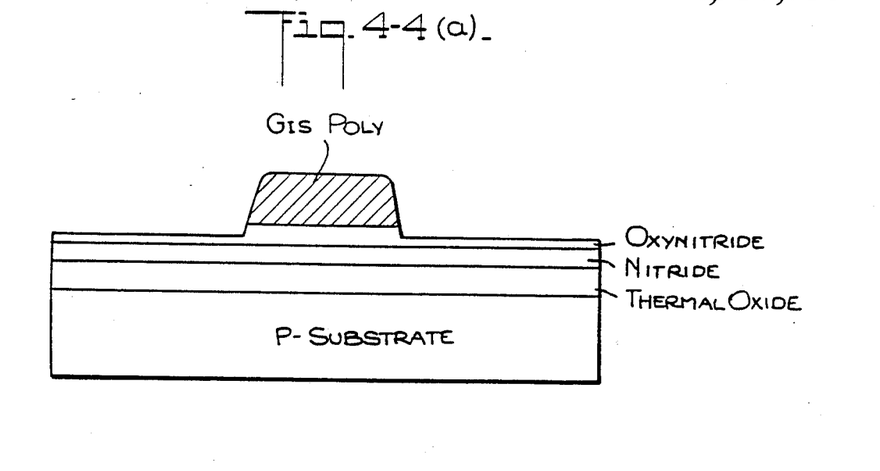
Figures 4, 4B:
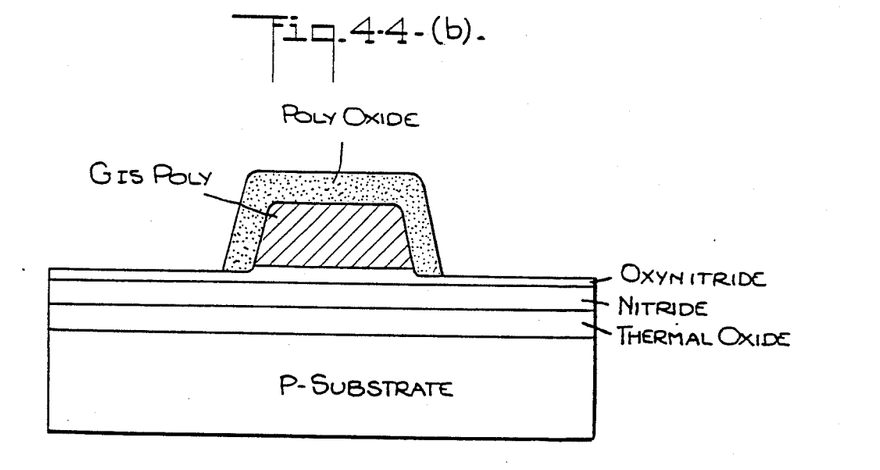

Secondly, a closed structure is designed as shown in FIG. 3. Here the drain region is surrounded by gate region to cut off the leakage path. This construct still has low packing density and large coupling capacitance between the gate and the drain. Again, the speed of operation is reduced.

Thirdly, the conventional LOCOS process is replaced by another process. Unfortunately, these alternatives are still developmental and have not achieved commercial application (K. Kasama et al. "A Radiation-Hard Insulator for MOS LSI Device Isolation,", *IEEE Transactions on Nuclear Science*, NS-32, No. 6, 3965–3970 (1985)).

BRIEF DESCRIPTION OF THE INVENTION

This invention relates to a radiation-hardened bulk CMOS process and a new isolation structure which replaces the conventional LOCOS field oxide. The structure may be automatically generated by rapid and simple layout procedures employing a workstation and a commercial layout tool. This unique approach makes it possible to expeditiously fabricate a radiation-hardened VLSI circuit and to easily modify existing commercial products to form a radiation-hardened version without need for redesigning such products.

DESCRIPTION OF THE DRAWINGS

FIG. 4-1-(a) illustrates a vertical cross-section of a portion of an integrated circuit embodying the invention showing the polysilicon gated isolation structure (GIS) locally adopted as electrical isolation between active N-channel MOSFETs in a CMOS.

FIG. 4-1-(b) represents a top view of the integrated circuit shown in the previous figure, illustrating the GIS, particularly in relation to the N-channels.

FIGS. 4-2 to 4-6 illustrate the formation of the device of the invention at various stages in the process. The completed device is shown in FIG. 4-6.

FIGS. 5-0 to 5-7 show the layout procedure employed in developing the GIS.

FIG. 5-0 shows the pattern generated for the thin oxide regions including the N-channel and P-channel.

FIG. 5-1 shows the pattern generated for the N-channel thin oxide region.

FIGS. 5-2-I and 5-2-II show the modification of the N-channel thin oxide region formed in step 2.

FIG. 5-3 shows the combining of the P-channel thin oxide region and the modified N-channel thin oxide region. Pattern A5 is the actual thin oxide layer used in the photolithography.

FIG. 5-4 shows the generation of the gated isolation structure for the N-channel device.

FIG. 5-5 shows the generation of the isolation implant region for the gated isolation structure.

FIG. 5-6 shows the patterning of the contact regions.

FIG. 5-7 shows the modification of the contact regions for electrically connecting the gated isolation structure to Vss.

FIG. 5-8 shows the flow chart using the automatic procedures and commands to construct a GIS layout structure in accordance with the invention.

DETAILED DESCRIPTION OF THE INVENTION

Because the gated isolation structure of the instant invention is integrated into the process for radiation-hardening, the process becomes a double polysilicon CMOS process. The first polysilicon layer is an isolation gate and the second polysilicon layer is the active device gate.

Figure 41:
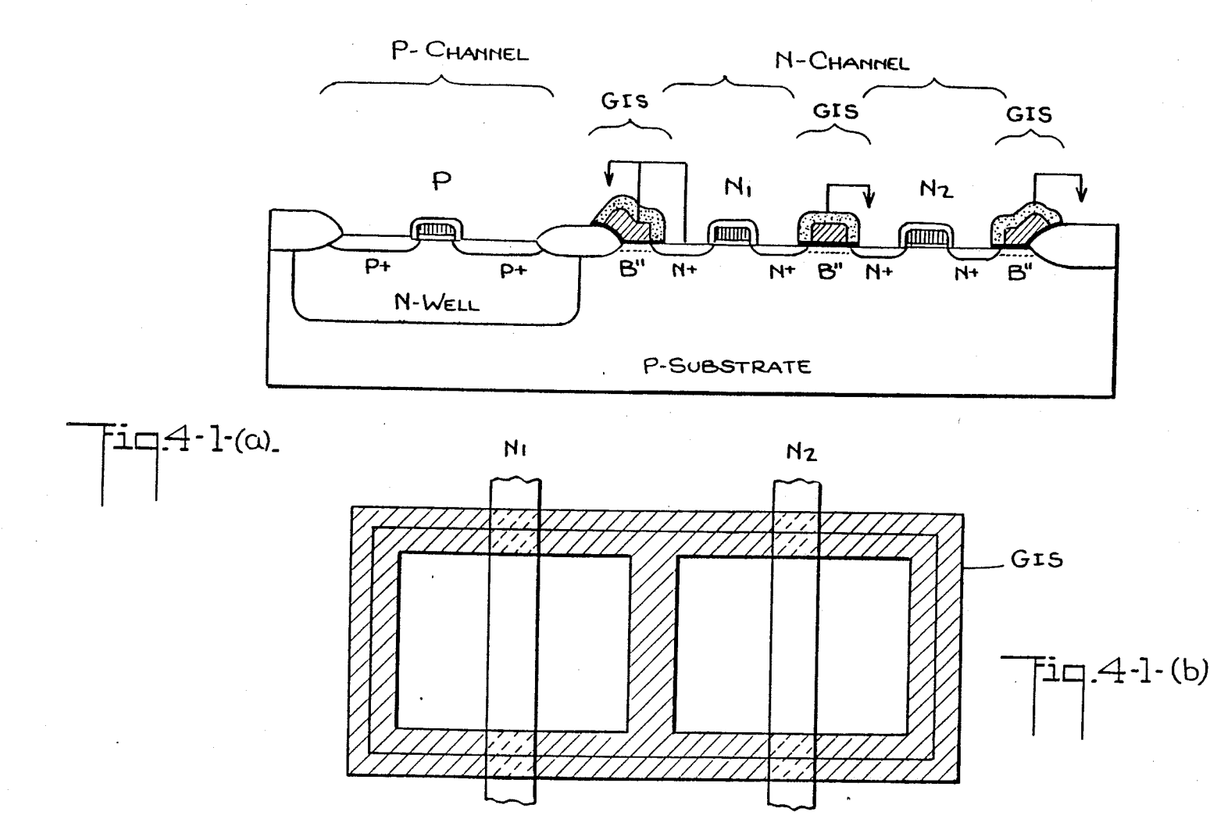

FIG. 4-1-(a) shows a vertical section of the polysilicon gated isolation structure of the invention. The GIS serves to provide local electrical isolation about the active n-MOSFETs in the CMOS integrated circuit figure. FIG. 4-1-(b) illustrates a top view of a portion of the CMOS showing the gated isolation structure with respect to the two N-channels, $N_1$ and $N_2$. This gate isolation structure is equivalent to an N-channel MOS- FET and will be biased at the Vss=OV when the circuit is in operation. The isolation gate is kept at 0 bias to lower the threshold voltage shift of equivalent GIS MOSFETs after irradiation and to achieve electrical isolation between the active devices.

Figure 42:
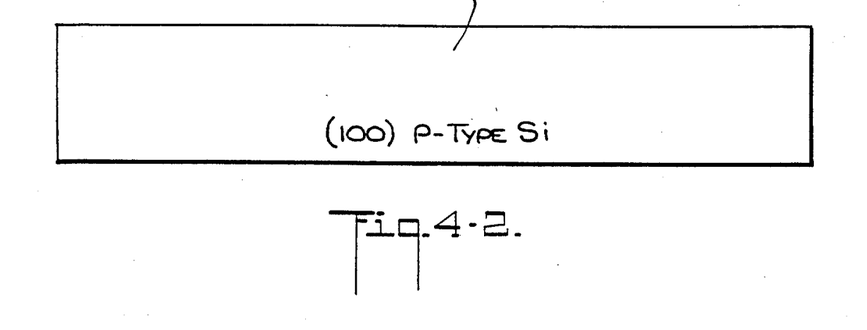

To commence the process of the invention, as shown in FIG. 4-2, a processing wafer 1, typically a p-type substrate with a resistivity of less than 65 ohm-cm and with a (100) orientation, is used. An isotropic epitaxial layer is grown on the bare P-substrate to provide latch-up immunity. The thickness of the epitaxial layer depends on the P+ to N− well and N+ to P− substrate rules.

Figure 43:
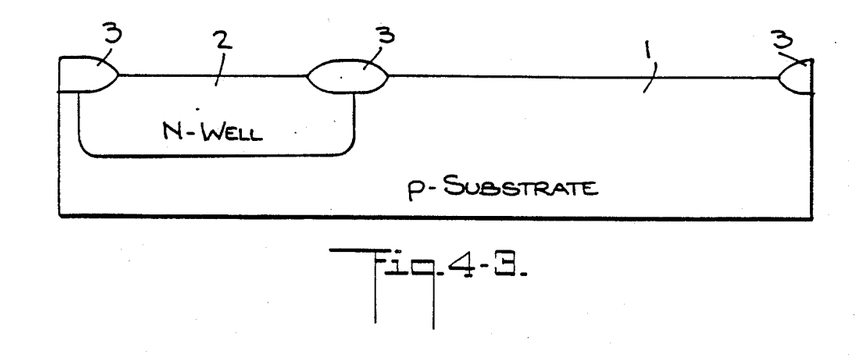

FIG. 4-3 shows the formation of the N-well 2 and field oxide 3. In the gated isolation structure process, the N-well 2 is selected as the substrate for a P-channel active devices. It is formed in a conventional manner by $P^{31}$ ion implantation followed by high temperature drive-in. The implant energy, implant dose and drive-in temperatures are properly adjusted to obtain 3.5 to 4.5 um depth for the N-well with a sheet resistance of 1200 to 1500 ohm/sq. to comply with the 2 um design rule. The field oxide 3 which serves to isolate the P-channel device to P-channel or to N-channel device is grown to 7000 to 8000 Ang. by local oxidation of silicon (LOCOS) processing. The temperature is approximately 980° C. or higher.

Figure 44:
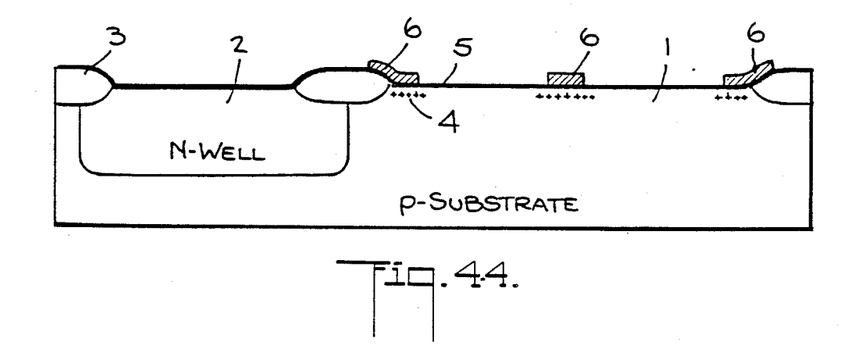

FIG. 4-4 shows the formation of the gated isolation structure. Before the GIS is defined, a certain amount of $B^{11}$ is implanted into the isolation region, shown by the numeral 4 to adjust the threshold voltage of the GIS. The dopant concentration is dependent on the threshold voltage shift induced by irradiation and device characteristics, it being understood that junction breakdown may occur at the isolation region/N+ junction if the dopant concentration is too high. Usually the concentration is not higher than 1E13 cm−2. The composite thermal oxide/nitride/oxynitride (ONO) structure is chosen as the GIS gate insulator 5. These layers are shown in detail on FIGS. 4-4(a) and 4-4-(b). The appropriate thickness of these layers depends on the radiation immunity of the composite film, the etching recipe for GIS polysilicon, and the integrity of the gate insulator. An insulator composition of 110 Ang. for the thermal bottom oxide, 110 Ang. for the chemical vapor deposition (CVD) intermediate silicon nitride, and 30 to 40 Ang. for the thermal oxynitride layer is typical.

In order to achieve the outstanding results of the invention, it is necessary that an ONO structure be chosen as the GIS gate insulator. The reason is that the nitride is a better material than thermal oxide with respect to radiation hardness. The oxynitride serves as the etching stopper for the GIS polysilicon 6, the thickness thereof being from 3,000 to 4,500 Ang. This layer is deposited on the ONO by CVD and doped with POCl$_3$ to obtain a sheet resistance of 10 to 20 ohm/sq. The GIS pattern is defined by using SF$_6$/Ar plasma dry etching. The etching recipe must be highly selective for the polysilicon to silicon dioxide so that the end point can be just stop at the oxynitride layer, consuming at most a small bit of the intermediate nitride. This is illustrated in FIG. 4-4-(a).

Figure 45:
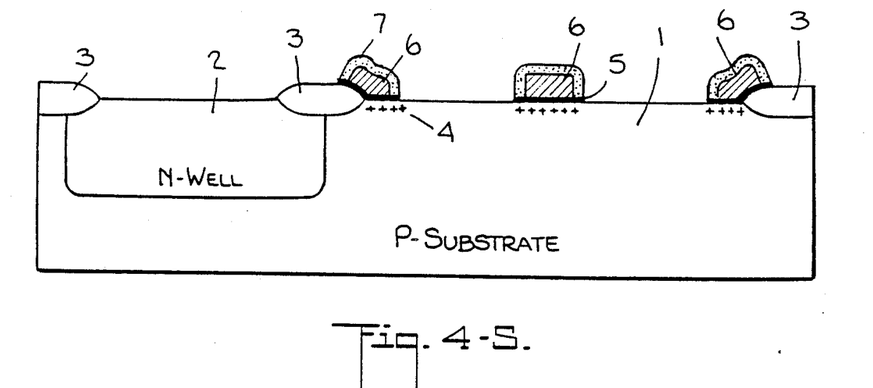

Because the nitride is difficult to oxidize, it serves as an oxidation mask for the thin oxide region when the GIS polyoxide 7 is grown. This layer 7, shown in FIGS. 4-4-(b) and 4-5, electrically isolates the GIS and the active device gate. In order to minimize parasitic capacitance, the thickness of the GIS polyoxide must not be less than 2,000 Ang. On the other hand, a thermal oxide layer may be used for the GIS gate insulator, but this is not preferred because, due to the lack of an oxidation mask, it is not easy to control the thickness and integrity of the GIS polyoxide when the thick residual oxide on top of the thin oxide region is etched back. For this reason, the use of nitride is most desirable.

Figure 46:
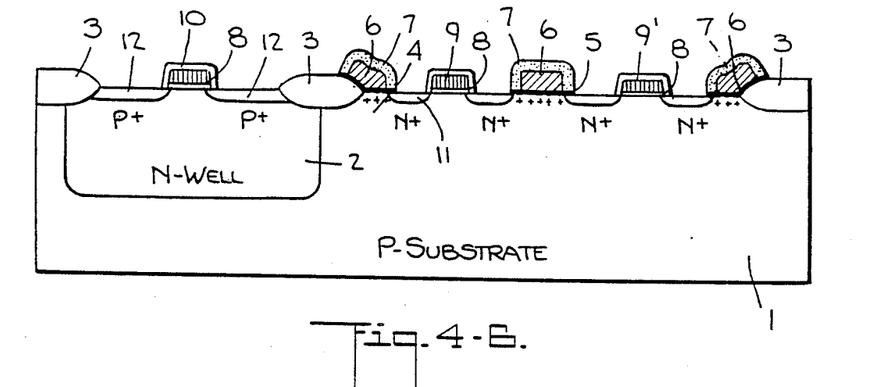

FIG. 4-6 shows the formation of the N-channel and P-channel MOSFET. After removing the residual ONO layer by a suitable chemical solution, the threshold voltage of the N-channel and P-channel MOSFET is adjusted by ion implantation. Thereafter an active gate oxide 8 with a thickness of 250 to 300 Ang. is grown. The standard method for preparing the radiation-hardened gate oxide is either to use wet oxygen at 850° C. or dry oxygen with or without HCl at 920°–1000° C. To enhance radiation immunity, subsequent processes are all performed at a temperature lower than that at which the gate oxide is formed. This includes the gate polysilicon 9, 9', and 10, shown in FIG. 4-6. The thicknesses of these layers is 4000–5000 Ang. They are deposited on the gate oxide by CVD and doped with phosphorus using POCl$_3$ doping at 850°–900° C. Once again, the polysilicon gate is defined using SF$_6$/Ar plasma etching and an etching recipe similar to that used in forming the gate isolation structure to obtain a reliable gate length.

The source/drain junctions of N-channel 11 and 11' and P-channel 12 are formed by self-aligned ion implantation into the P-substrate and N-well regions, respectively. Typically, the dopant is $B^{11}$ for P-channel and $P^{31}$ for N-channel, while dopant concentration is on the order of approximately $10^{15}$. These two junction dopants are driven in simultaneously at a later flow step.

The electrical isolation between the P-channel and N-channel and between N-channel and N-channel devices is achieved effectively by the gated isolation structure constructed by the aforesaid steps. To illustrate the effectiveness of the device of the instant invention, 2 um 2K×8 bit CMOS SRAM was tested for performance before and after radiation with cobalt$^{60}$ using various dosage levels. The chips Nos. 1, 2 and 3 were exposed to 100, 200 and 350 RADS, respectively. The data obtained are shown in the following table:

TABLE 1

| CHIP No. | BEFORE EXPOSURE | | | AFTER EXPOSURE | | |
|---|---|---|---|---|---|---|
| | Icc (sta) | Icc (OP) | Speed (Acc time) | Icc (sta) | Icc (OP) | Speed (Acc time) |
| 1 | .31uA | 1.9mA | 95.4nS | 35.0uA | 16.5mA | 85.7nS |
| 2 | .24uA | 1.7mA | 90.0nS | 24.0uA | 17.5mA | 89.7nS |
| 3 | .293uA | 4.0mA | 90.3nS | 25.0uA | 17.14mA | 77.3nS |

Even after exposure to 350K rads, the device of the invention still remains within data sheet limits. The typical access time is approximately 100 nsec. and the maximum stand-by (Icc Sta) and operational (Icc OP) currents are about 50 microamperes and 20 milliamperes, respectively.

The use of computer-assisted design (CAD) to construct the GIS structure directly at a computer terminal with a command file is concisely described by reference to FIGS. 5-0 through 5-7.

As shown in FIG. 5-0, the first step is to search and/or generate by the design rule the pattern for the thin oxide regions including N-channel and P-channel. The thin oxide region is represented by A1. Thereafter, the search and generation of the N-channel thin oxide region is made by CAD and defined as A2, as shown in FIG. 5-1. The searching method takes the intersection of the P-field implantation region and the thin oxide region A1, the P-channel thin oxide region thus equalling A1 minus A2.

Figure 53:
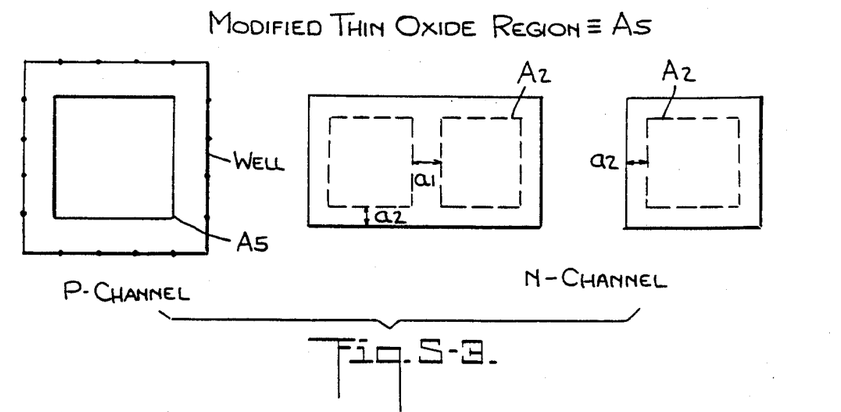

FIG. 5-2-(I) shows the modification of the N-channel thin oxide region from step 2. Initially a design rule check (DRC) is performed. If the spacing between the thin oxide region is equal to or smaller than a1 um, the thin oxide regions are directly merged to define the new thin oxide region A3. The merged thin oxide regions are outwardly extended by a2 um, as shown in FIG. 5-2-(II), and defined as A4. As illustrated in FIG. 5-3, the P-channel thin oxide regions and the modified N-channel thin oxide regions are united and defined as A5. A5 thus represents the actual thin oxide layer in the photolithography processes.

Figure 54:
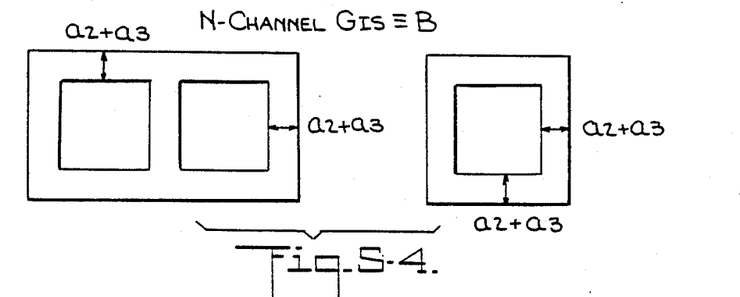

FIG. 5-4 shows the generation of the GIS region B for the N-channel device. This region is formed by outwardly extending A4 by a3 um and then substracting the A2 region from the extended A4. (This is done because A2 is included in or extends A4.)

Figure 55:
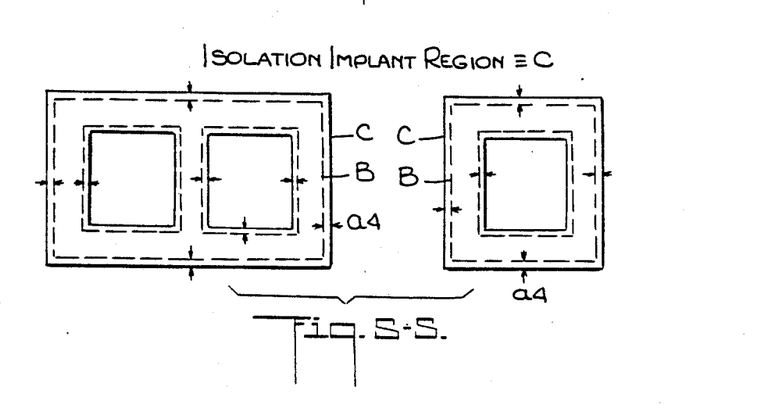

The genertion of the isolation implant region C for the GIS is shown in FIG. 5-5. The isolation implant region is directly constructed by outwardly extending the GIS region B by a4 um.

Figure 56:
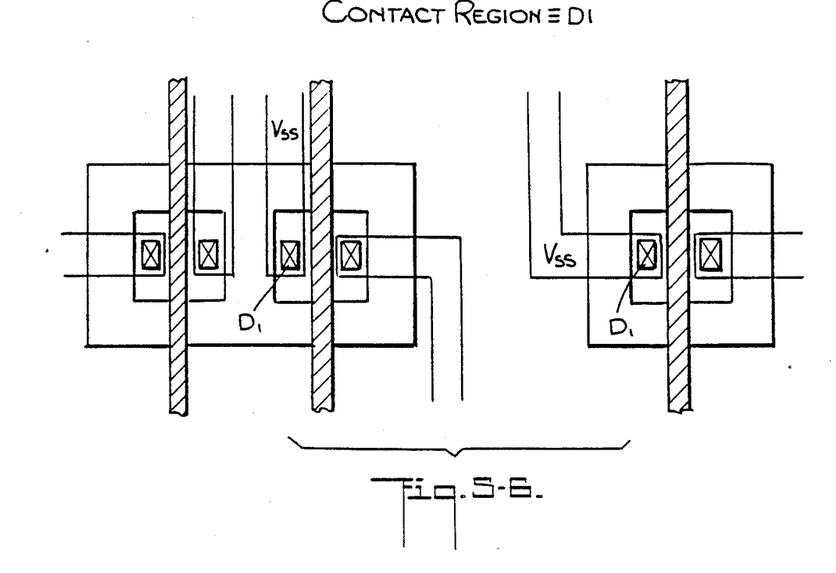
Figure 57:
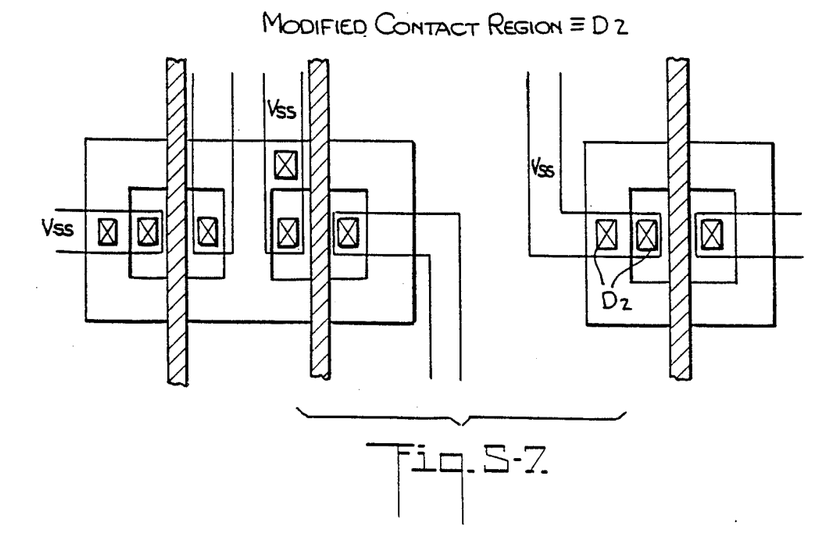

FIG. 5-6 shows the pattern for the contact regions generated by the standard rule to define D1. FIG. 5-7 shows the modifications of the contact regions for electrically connecting the GIS to the Vss. This is done by first taking the overlap regions of the Vss metal line and GIS and then inwardly shrinking it by a5 um. The GIS is thus electrically connected to ground through the new generated contact. Thereafter, the newly generated contact region is combined with the normally designed contact region and defined as D2.

Design rule checks (DRC) and electrical rule checks (ERC) are peformed. The purpose of performing design rule checks is to eliminate the line to line overlap between GIS and active device gate pattern which may result in the formation of a metal ribbon after metal line definition. The purpose of performing electrical rule checks is to screen out the electrical floating GIS and contact regions which violate design rule. The abnormal GIS and contact regions are processed further by manual or automatic assignment.

The values of a1, a2, a3, a4 and a5 depend on process capabilities and can be readily determined by those skilled in the art. Based on a 2 um process design rule, representative values are as follows:

| Parameter | Dimension, um |
| --- | --- |
| a1 | 5 |
| a2 | 2 |
| a3 | 1 |
| a4 | 0.5 |
| a5 | 0.5 |

The GIS of the invention can be adapted as electrical isolation parts not only between N-channels in P-substrates, but also for P-channels in the N-well. Thus, the conventional LOCOS field oxide will be wholly replaced by GIS.

What is claimed is:

1. A method for automatically revising non-radiation-hardened CMOS circuits/products to radiation-hardened versions, comprising the steps:
   (a) searching the original N-channel thin oxide region of a non-radaition-hardened circuit layout;
   (b) modifying the original N-channel thin oxide region to a gated isolation structure (GIS) through a series of commands, said commands being at least one of simply extending, shrinking and subtracting instructions, the final dimension of said GIS being based on process capability;
   (c) generating isolation implant regions directly from said GIS region under constraint layout rules, said isolation implant regions adjusting the GIS threshold voltage, the generating procedure being simply extending and subtracting steps;
   (d) generating contact regions by directly taking the intersection of said GIS regions and the Vss metal region of said circuit layout, then shrinking the intersection regions to a contact region under constraint layout rules, said contact regions connecting the GIS to ground potential;
   (e) performing electrical and design rule checks for eliminating floating gated isolation structure and contact regions which do not conform to design rule, said checks assuring that the GIS is maintained at Vss potential and will not be turned ON during circuit operation.

2. The method as claimed in claim 1, wherein said gated isolation structure is compatible with dynamic RAM cell structure.

* * * * *

UNITED STATES PATENT AND TRADEMARK OFFICE
CERTIFICATE OF CORRECTION

PATENT NO. : 4,937,756
DATED : June 26, 1990
INVENTOR(S) : HSU, J.

It is certified that error appears in the above-identified patent and that said Letters Patent is hereby corrected as shown below:

On the title page, change [54] "GATED ISOLATED STRUCTURE" to --[54] GATED ISOLATION STRUCTURE--.

At Column 1, first line, change "GATED ISOLATED STRUCTURE" to --GATED ISOLATION STRUCTURE--.

Signed and Sealed this

Fifth Day of May, 1992

*Attest:*

DOUGLAS B. COMER

*Attesting Officer*  *Acting Commissioner of Patents and Trademarks*